(12) United States Patent
Na (10) Patent No.: US 8,009,493 B2
(45) Date of Patent: Aug. 30, 2011

(54) SEMICONDUCTOR MEMORY APPARATUS AND TEST METHOD THEREOF

(75) Inventor: Eun Sung Na, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 84 days.

(21) Appl. No.: 12/633,886

(22) Filed: Dec. 9, 2009

(65) Prior Publication Data

US 2010/0309738 A1  Dec. 9, 2010

(30) Foreign Application Priority Data

Jun. 8, 2009 (KR) .................. 10-2009-0050430

(51) Int. Cl.
*G11C 29/08* (2006.01)
(52) U.S. Cl. ......... 365/201; 365/149; 365/190; 365/207
(58) Field of Classification Search .................. None
See application file for complete search history.

(56) References Cited

U.S. PATENT DOCUMENTS

| 5,034,923 | A | * | 7/1991 | Kuo et al. | 365/189.16 |
| 5,263,031 | A | | 11/1993 | Inoue | |
| 5,594,694 | A | * | 1/1997 | Roohparvar et al. | 365/201 |
| 5,687,180 | A | | 11/1997 | Kawasaki | |
| 5,848,018 | A | * | 12/1998 | McClure | 365/201 |
| 5,901,105 | A | | 5/1999 | Ong et al. | |
| 6,584,007 | B2 | * | 6/2003 | McClure | 365/145 |
| 6,940,765 | B2 | | 9/2005 | Kyung | |
| 7,471,579 | B2 | * | 12/2008 | Uchikoba et al. | 365/201 |

FOREIGN PATENT DOCUMENTS

| EP | 0947994 A2 * | 6/1999 |
| JP | 09-106698 A | 4/1997 |
| JP | 2005-071582 A | 3/2005 |
| KR | 100157292 B1 | 7/1998 |
| KR | 1020070044697 A | 4/2007 |

\* cited by examiner

*Primary Examiner* — Tan T. Nguyen
(74) *Attorney, Agent, or Firm* — Ladas & Parry LLP (57) ABSTRACT

A semiconductor memory apparatus includes a bit line pair electrically connected to a memory cell and a bit line sense amplifier for detecting and amplifying voltage levels of the bit line pair. The semiconductor memory apparatus is configured to perform a test to determine the occurrence of leakage current by deactivating the bit line sense amplifier and applying a test voltage to the bit line pair when the semiconductor memory apparatus is in test mode.

27 Claims, 7 Drawing Sheets

SEMICONDUCTOR MEMORY APPARATUS AND TEST METHOD THEREOF

CROSS-REFERENCES TO RELATED APPLICATION

The present application claims priority under U.S.C 119(a) to Korean Application No. 10-2009-0050430, filed on Jun. 8, 2009 in the Korean Intellectual Property Office, which is incorporated by reference in its entirety as set forth in full.

BACKGROUND

1. Technical Field

Embodiments of the present invention relate generally to a semiconductor memory apparatus, and more particularly, to testing of a semiconductor memory apparatus.

2. Related Art

With the recent trend toward high capacity and high integration in a semiconductor memory apparatus, the number of memory cells has increased rapidly, and efforts to refine the manufacturing process of the semiconductor memory apparatus have been carried out in an attempt to facilitate the increased number of memory cells. However, a consequence of the increased number of memory cells is the relatively frequent occurrence of process defects. In particular, the probability of a micro-bridge occurring between lines of the semiconductor memory apparatus has increased. The micro-bridge causes leakage current, and an increase in leakage current makes it difficult to achieve reliable operation of the semiconductor memory apparatus.

Therefore, it is desirable to develop a test to detect leakage current and the occurrence of a micro-bridge. However, when considering the large number of bit lines electrically connected to memory cells and the many data input/output (hereinafter abbreviated to as 'I/O') lines transferring data in the semiconductor memory apparatus, one can conceive that the time taken to perform a test to detect leakage current and the micro-bridge would be great. For example, conventional methods of detecting leakage current in a memory cell require a complicated procedure in which data '1' is stored in a memory cell and the word line electrically connected to the memory cell is individually enabled in order to verify the occurrence of leakage current. Accordingly, the time required to effectively perform the test on a semiconductor memory apparatus is quite large, which in turn causes an increase in manufacturing cost and the like.

SUMMARY OF THE INVENTION

Embodiments of the present invention include a semiconductor memory apparatus capable of efficiently performing a test for detecting defects of the semiconductor memory apparatus within a short time and a test method thereof.

In one embodiment of the present invention, a semiconductor memory apparatus is configured to perform a test by deactivating a bit line sense amplifier and applying a test voltage to a bit line pair in a test mode.

In another embodiment of the present invention, a semiconductor memory apparatus includes a plurality of bit line pairs electrically connected to memory cells; a bit line sense amplifier group configured to detect and amplify voltage levels of the plurality of bit line pairs; a first data I/O lines configured to be electrically connected to the plurality of bit line pairs through a first switching transistor group which are controlled whether to be turned on/off in response to a plurality of control column select signals; a second data I/O lines configured to be electrically connected to the first data I/O lines through a second switching transistor group which are controlled whether to be turned on/off in response to a plurality of control I/O switching signals; and a test voltage applying unit configured to apply a test voltage to the second data I/O lines in response to a test mode signal.

In still another embodiment of the present invention, a test method of a semiconductor memory apparatus which includes: a plurality of bit line pairs electrically connected to memory cells; a first data I/O lines electrically connected to the plurality of bit line pairs through the first switching transistor group; and a second data I/O lines electrically connected to the first data I/O lines through the second switching transistor group is provided. The test method includes a performing a test of whether there are leakage currents between the second data I/O lines by applying test voltages to the second data I/O lines when a test mode signal is enabled.

In still another embodiment of the present invention, a test method of a semiconductor memory apparatus includes: a storing a first level data in memory cells; a deactivating a bit line sense amplifier group for detecting and amplifying a plurality of bit line pairs electrically connected to the memory cells when a test mode signal is enabled; a setting the plurality of bit line pairs to levels of a test voltage by applying the test voltages to the plurality of bit line pairs when the test mode signal is enabled; and a reading data stored in the memory cells.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a semiconductor memory apparatus and a test method thereof, according to the present invention, will be described below with reference to the accompanying drawings through preferred embodiments.

Figure 1:
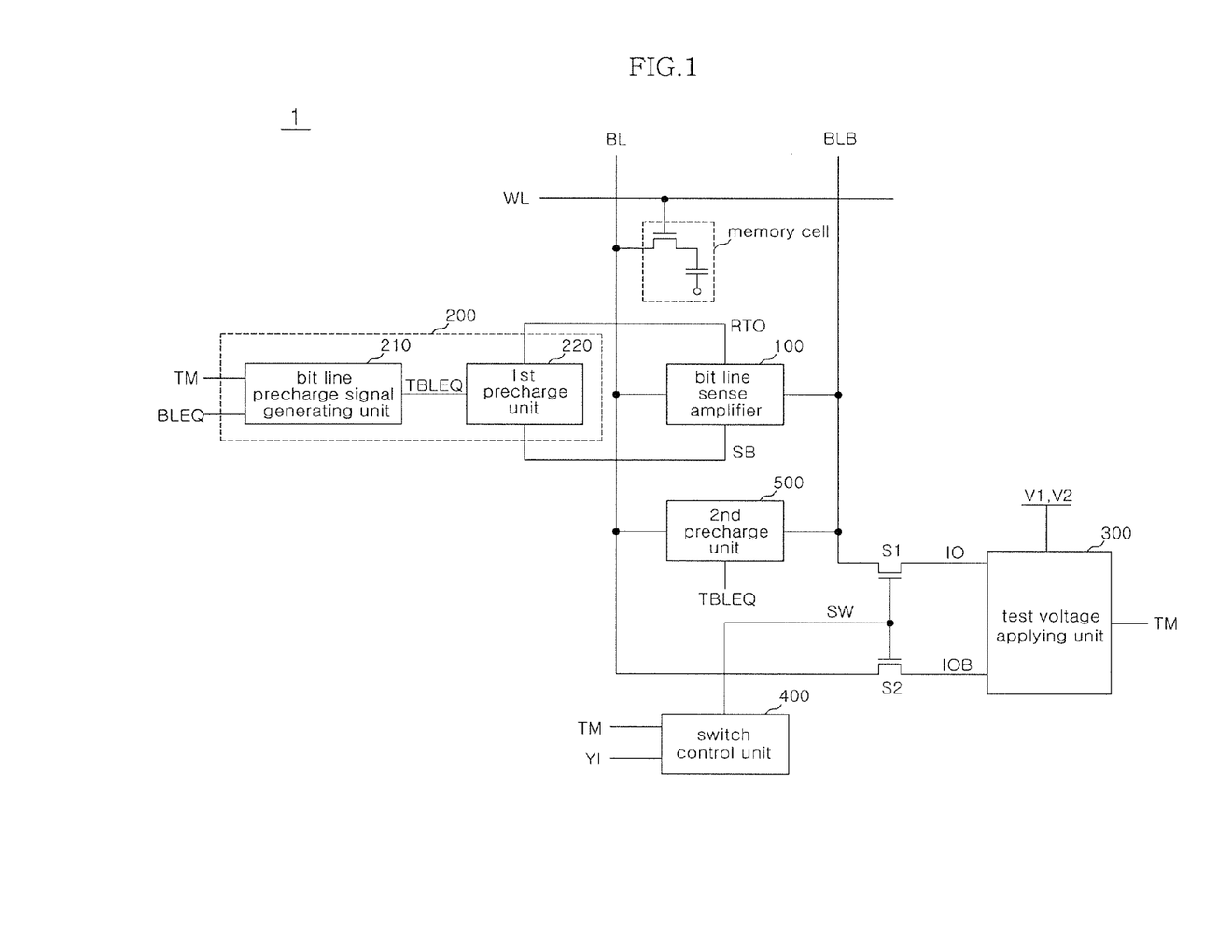
FIG. 1 is a block diagram schematically showing a configuration of a semiconductor memory apparatus according to an embodiment of the present invention.

FIG. 1 is a block diagram schematically showing a configuration of a semiconductor memory apparatus according to an embodiment of the present invention.

As shown in FIG. 1, a semiconductor memory apparatus 1 according to an embodiment of the invention includes a bit line pair BL and BLB, a bit line sense amplifier 100, a control unit 200, data I/O lines IO and IOB, and a test voltage applying unit 300.

When a test mode signal 'TM' is applied thereby causing the semiconductor memory apparatus 1 to enter into a test mode, the semiconductor memory apparatus 1 according to an embodiment performs a test by deactivating the bit line sense amplifier 100 and setting the bit line pair BL and BLB to levels of test voltages V1 and V2 for testing the semiconductor memory apparatus.

The bit line pair includes a bit line BL and a bit bar line BLB, and the bit line BL is electrically connected to a memory cell. The bit line sense amplifier 100 detects voltage levels of bit line pair BL and BLB, and then amplifies them. The bit line sense amplifier 100 includes two voltage source terminals RTO and SB and operates in response to the voltages received from the two voltage source terminals RTO and SB (i.e. the bit line sense amplifier is driven by the voltages applied to the two voltage source terminals RTO and SB). The control unit 200 is configured to receive the test mode signal 'TM' and a bit line equalizing signal 'BLEQ' and to then determine whether to activate the bit line sense amplifier 100. The test mode signal 'TM' is a signal which sets the semiconductor memory apparatus into a test mode whereby testing is performed on a semiconductor memory apparatus, and the bit line equalizing signal 'BLEQ' is a signal which is enabled to equalize the bit line pair BL and BLB to the level of bit line precharge voltage VBLP when the semiconductor memory apparatus performs a precharge operation.

When the test mode signal 'TM' is enabled to perform a test, the control unit 200 prevents the two voltage source terminals RTO and SB of the bit line sense amplifier 100 from receiving almost any voltage, thereby deactivating the bit line sense amplifier 100. In other words, the control unit 200 causes the two voltage source terminals RTO and SB of the bit line sense amplifier 100 to be floating nodes.

The control unit 200 includes a bit line precharge signal generating unit 210 and a first precharge unit 220. The bit line precharge signal generating unit 210 receives the test mode signal 'TM' and the bit line equalizing signal 'BLEQ' and uses these signals to generate a bit line precharge signal 'TBLEQ'. The bit line precharge signal generating unit 210 is configured to disable the bit line equalizing signal 'BLEQ' when the test mode signal 'TM' is enabled and to provide the bit line equalizing signal 'BLEQ' as the bit line precharge signal 'TBLEQ' when the test mode signal 'TM' is disabled.

The first precharge unit 220 provides a bit line precharge voltage VBLP to the two voltage source terminals RTO and SB of the bit line sense amplifier 100 in response to the bit line precharge signal 'TBLEQ'. In an embodiment, the voltage level of the bit line precharge voltage VBLP is half the voltage level of a core voltage used in a memory core of the semiconductor memory apparatus. The first precharge unit 220 provides the bit line precharge voltage VBLP to the two voltage source terminals RTO and SB of the bit line sense amplifier 100 when the bit line precharge signal 'TBLEQ' is enabled, and does not provide the bit line precharge voltage VBLP to the two voltage source terminals RTO and SB of the bit line sense amplifier 100 when the bit line precharge signal 'TBLEQ' is disabled, thereby deactivating the bit line sense amplifier 100. As a result, when the test mode signal 'TM' is enabled, the bit line precharge signal generating unit 210 disables the bit line precharge signal 'TBLEQ'; and the first precharge unit 220 responds to the disabled bit line precharge signal 'TBLEQ' by causing the two voltage source terminals RTO and SB of the bit line sense amplifier 100 to be floating nodes, thereby providing conditions under which voltage levels of the bit line pair BL and BLB may be easily changed to desired voltage levels.

The data I/O lines IO and IOB are connected electrically to the bit line pair BL and BLB. The data I/O lines IO and IOB transfer data of the memory cell, which is transferred through the bit line pair BL and BLB, to pads, and also transfer data inputted through the pads to the bit line pair BL and BLB. The data I/O lines IO and IOB are electrically connected to the bit line pair BL and BLB respectively, through switching transistors S1 and S2. The switching transistors S1 and S2 are controlled by a switching signal 'SW', and it is preferable that the switching signal 'SW' is enabled while the test mode signal 'TM' is enabled.

The test voltage applying unit 300 applies test voltages V1 and V2 to the data I/O lines IO and IOB when the test mode signal 'TM' is enabled. As described above, test mode signal 'TM' is enabled when the test is performed on the semiconductor memory apparatus 1. Accordingly, the test voltage applying unit 300 can apply the test voltages V1 and V2 to the data I/O lines IO and IOB and the bit line pair BL and BLB can be caused to be electrically connected to the data I/O lines IO and IOB in response to an enabled test most signal, and thereby the bit line pair BL and BLB can be set to the levels of test voltages V1 and V2.

The semiconductor memory apparatus 1 according to an embodiment can further include a switch control unit 400. The switch control unit 400 can generate the switching signal 'SW' by using both the test mode signal 'TM' and a column selection signal 'YI'. The column selection signal 'YI' is a signal generated from a column decoder to select columns of a semiconductor memory apparatus. In other words, the column selection signal 'YI' is a signal which is enabled to electrically connect the data I/O lines IO and IOB and the bit line pair BL and BLB to each other according to column addresses. The switch control unit 400 enables the switching signal 'SW' when the test mode signal 'TM' is enabled to perform the test on the semiconductor memory apparatus 1, and also provides the column selection signal 'YI' as the switching signal 'SW' when the test mode signal 'TM' is disabled.

In addition, the semiconductor memory apparatus 1 according to an embodiment can further include a second precharge unit 500. The second precharge unit 500 electrically connects the bit line pair BL and BLB to each other in response to the bit line precharge signal 'TBLEQ', and provides the bit line precharge voltage VBLP to the bit line pair BL and BLB. The second precharge unit 500 is configured so as to not electrically connect the bit line pair BL and BLB with each other when the bit line precharge signal 'TBLEQ' is disabled.

Figure 2:
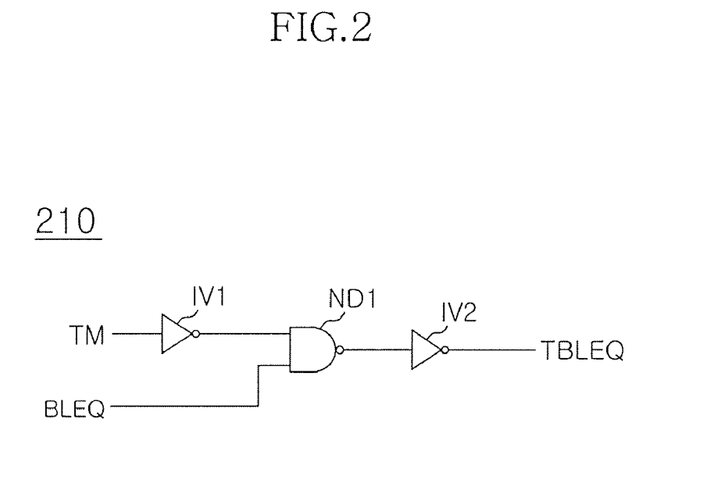
FIG. 2 is a diagram showing a configuration of an embodiment of the bit line precharge signal generating unit of FIG. 1.

FIG. 2 is a diagram showing a configuration of the bit line precharge signal generating unit of FIG. 1. The embodiment of the bit line precharge signal generating unit 210 shown in FIG. 2 includes a first inverter IV1, a first NAND gate ND1 and a second inverter IV2. The first inverter IV1 inverts the test mode signal 'TM'. The first NAND gate ND1 receives the output of the first inverter IV1 and the bit line equalizing signal 'BLEQ' as inputs. The second inverter IV2 inverts the output of the first NAND gate ND1 to generate the bit line precharge signal 'TBLEQ'. Therefore, when the test mode signal 'TM' is enabled, the bit line precharge signal generating unit 210 generates a disabled bit line precharge signal 'TBLEQ'.

Figure 3:
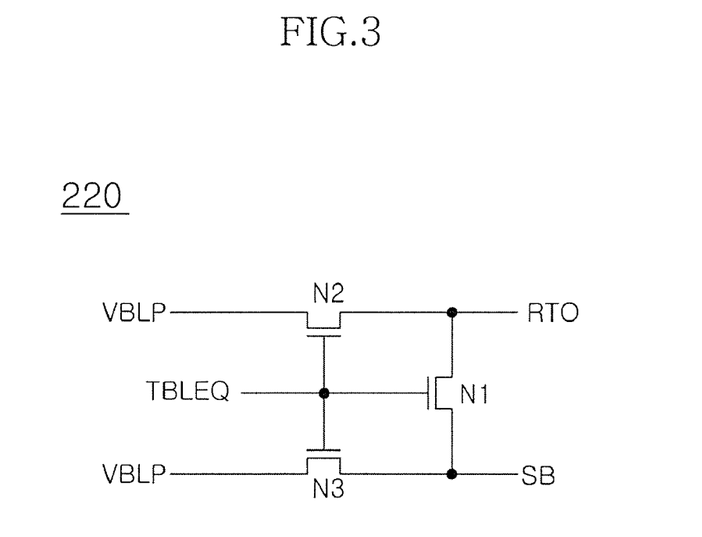
FIG. 3 is a diagram showing a configuration of an embodiment of the first precharge unit of FIG. 1.

FIG. 3 is a diagram showing a configuration of an embodiment of the first precharge unit of FIG. 1. As shown in FIG. 3, the first precharge unit 220 includes first to third NMOS transistors N1 to N3. The bit line precharge signal 'TBLEQ' is input to the gate of each of the first to third NMOS transistors N1 to N3, to control the operation (i.e., on or off) of the respective transistors. When the bit line precharge signal 'TBLEQ' is enabled, all of the first to third NMOS transistors N1 to N3 are turned on to provide the bit line precharge voltage VBLP to the two voltage source terminals RTO and SB of the bit line sense amplifier 100, and when the bit line precharge signal 'TBLEQ' is disabled, all of the first to third NMOS transistors N1 to N3 are turned off to cause the two voltage source terminals RTO and SB of the bit line sense amplifier 100 to be floating nodes.

Figure 4:
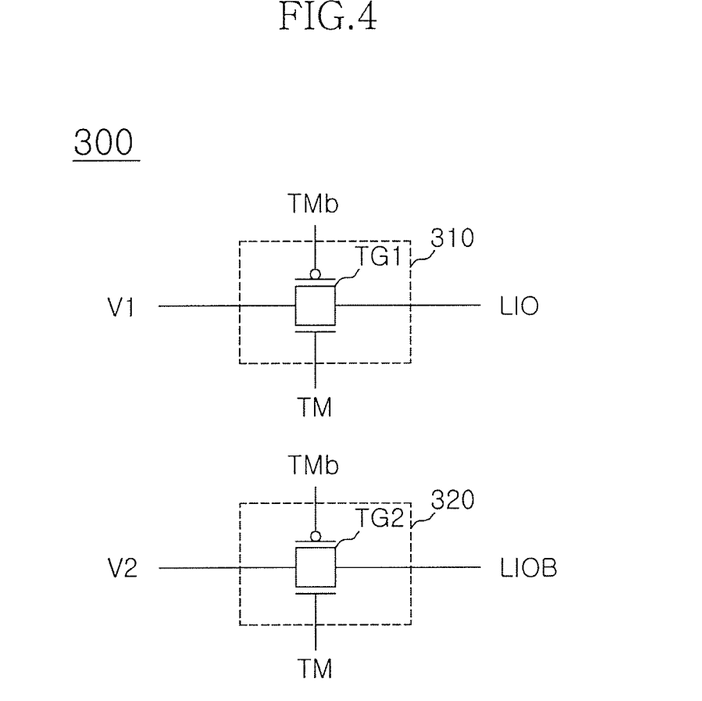
FIG. 4 is a diagram showing a configuration of the embodiment of a test voltage applying unit of FIG. 1.

FIG. 4 is a diagram showing a configuration of an embodiment of the test voltage applying unit of FIG. 1. The embodiment of the test voltage applying unit 300 shown in FIG. 4 includes a first voltage applying unit 310 and a second voltage applying unit 320. The test voltage can include first and second test voltages V1 and V2. The first voltage applying unit 310 applies the first test voltage V1 to the data I/O line IO in response to the test mode signals 'TM' and 'TMb' ('TMb' denotes an inverted test mode signal 'TM'), and similarly the second voltage applying unit 320 applies the second test voltage V2 to the data I/O line IOB in response to the test mode signals 'TM' and 'TMb'. The first and second test voltages V1 and V2 may have the same voltage level or different voltage levels. In other words, levels of the first and second test voltages V1 and V2 can be changed arbitrarily according to the purposes of applications and tests. Further, the respective first and second test voltages V1 and V2 may be either a positive voltage or a negative voltage according to the purposes of tests.

As shown in FIG. 4, the first and second voltage applying units 310 and 320 include first and second transfer gates TG1 and TG2 respectively. The first transfer gate TG1 determines whether to apply the first test voltage V1 according to the enablement of the test mode signal 'TM', and similarly the second transfer gate TG2 determines whether to apply the second test voltage V2 according to the enablement of the test mode signal 'TM'.

Figure 5:
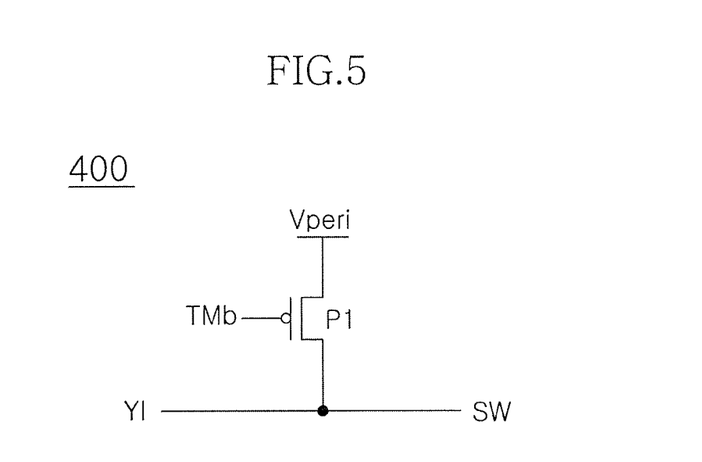
FIG. 5 is a diagram showing a configuration of an embodiment of the switch control unit of FIG. 1.

FIG. 5 is a diagram showing a configuration of an embodiment of the switch control unit of FIG. 1. As shown in FIG. 5, the switch control unit 400 can include a first PMOS transistor P1. The gate of the first PMOS transistor P1 receives the signal 'TMb', which is an inverted test mode signal 'TM'; a voltage Vperi is applied to the source terminal of the first PMOS transistor P1, and the drain terminal is coupled to the line to which switching signal 'SW' is outputted. Further, the column selection signal 'YI' is directly connected to the line to which switching signal 'SW' is outputted. The voltage Vperi, which is applied to the source terminal of the first PMOS transistor P1, may be a peripheral voltage which arises when the column selection signal 'YI' is enabled. The peripheral voltage is a voltage used in a peripheral circuit region located inside of the semiconductor memory apparatus 1. When the test mode signal 'TM' is enabled, the first PMOS transistor P1 receives the signal 'TMb' (which is an inverted test mode signal 'TM') and then is turned on, thereby making it possible to enable the switching signal 'SW'. Therefore, when the test mode signal 'TM' is enabled, the switch control unit 400 enables the switching signal 'SW', and when the test mode signal 'TM' is disabled, the switch control unit 400 can provide the column selection signal 'YI' as the switching signal 'SW'.

Figure 6:
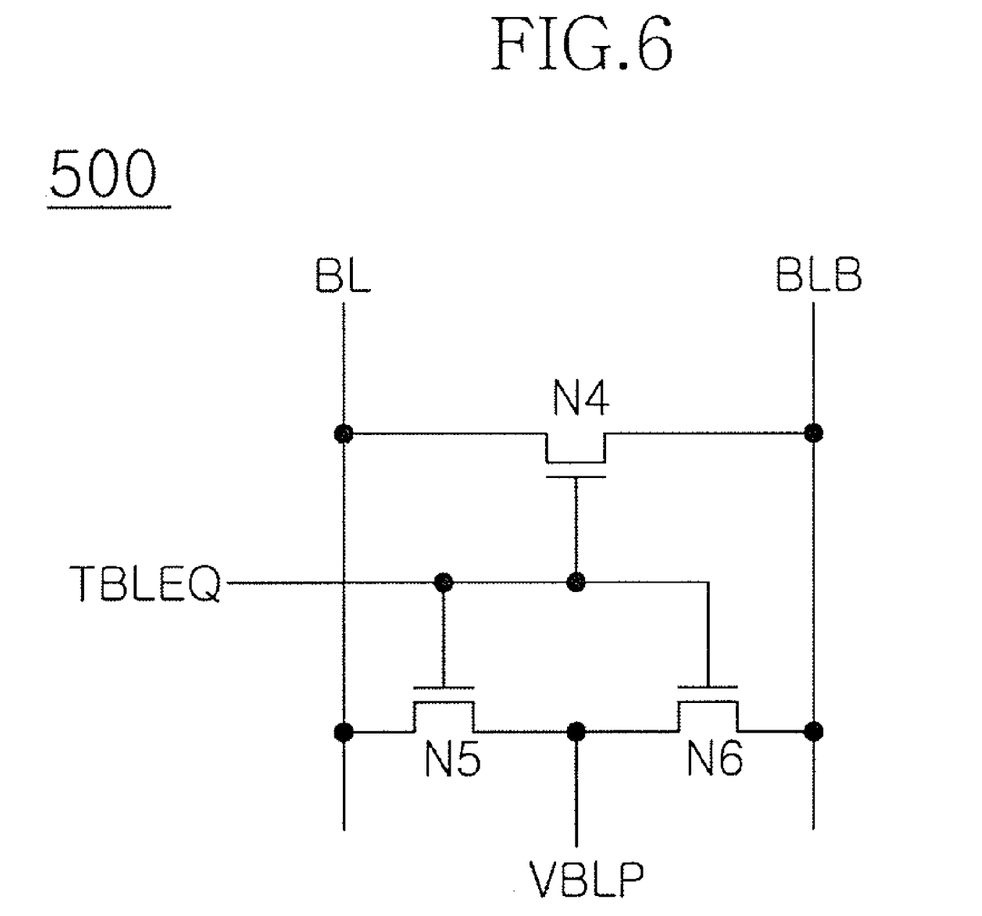
FIG. 6 is a diagram showing a configuration of an embodiment of the second precharge unit of FIG. 1.

FIG. 6 is a diagram showing a configuration of an embodiment of the second precharge unit of FIG. 1. As shown in FIG. 6, the second precharge unit 500 includes fourth to sixth NMOS transistors N4 to N6. Each of the gates of the fourth to sixth NMOS transistors N4 to N6 receives the bit line precharge signal 'TBLEQ', and thus the bit line precharge signal 'TBLEQ' controls whether the fourth to sixth NMOS transistors are turned on or off. When the bit line precharge signal 'TBLEQ' is enabled, all of the fourth to sixth NMOS transistors N4 to N6 are turned on to electrically connect the bit line pair BL and BLB and provide the bit line precharge voltage VLBP to the bit line pair BL and BLB; and when the bit line precharge signal 'TBLEQ' is disabled, the fourth to sixth NMOS transistors N4 to N6 are turned off and thus do not connect the bit line pair BL and BLB to each other or to the bit line precharge voltage VLBP.

Referring to FIGS. 1 to 6, operations of the semiconductor memory apparatus 1 according to an embodiment will be described below. Firstly, to perform the test on the semiconductor memory apparatus 1, the test mode signal 'TM' is enabled. When the test mode signal 'TM' is enabled, the bit line precharge signal generating unit 210 generates the bit line precharge signal 'TBLEQ' in its disabled state regardless of the value of the bit line equalizing signal 'BLEQ'. In response to the disabled bit line precharge signal 'TBLEQ', the first precharge unit 220 causes the two voltage source terminals RTO and SB of the bit line sense amplifier 100 to be floating nodes thereby deactivating the bit line sense amplifier 100. Therefore, the bit line sense amplifier 100 cannot have an affect on the voltage levels of the bit line pair BL and BLB. The second precharge unit 500 ensures the bit line pair BL and BLB is disconnected from each other in response to the disabled bit line precharge signal 'TBLEQ'. The test voltage applying unit 300 applies the first test voltage V1 to the data I/O line IO and the second test voltage V2 to the data I/O line IOB.

When the test mode signal 'TM' is enabled, the switching signal 'SW' is enabled, and thus the switching transistors S1 and S2, which respectively electrically connect the data I/O lines IO and IOB to the bit line pair BL and BLB, are turned on. Therefore, the bit line pair BL and BLB becomes the levels of first and second test voltages V1 and V2 respectively, thereby making it possible to perform the test on the semiconductor memory apparatus 1.

Figure 7:
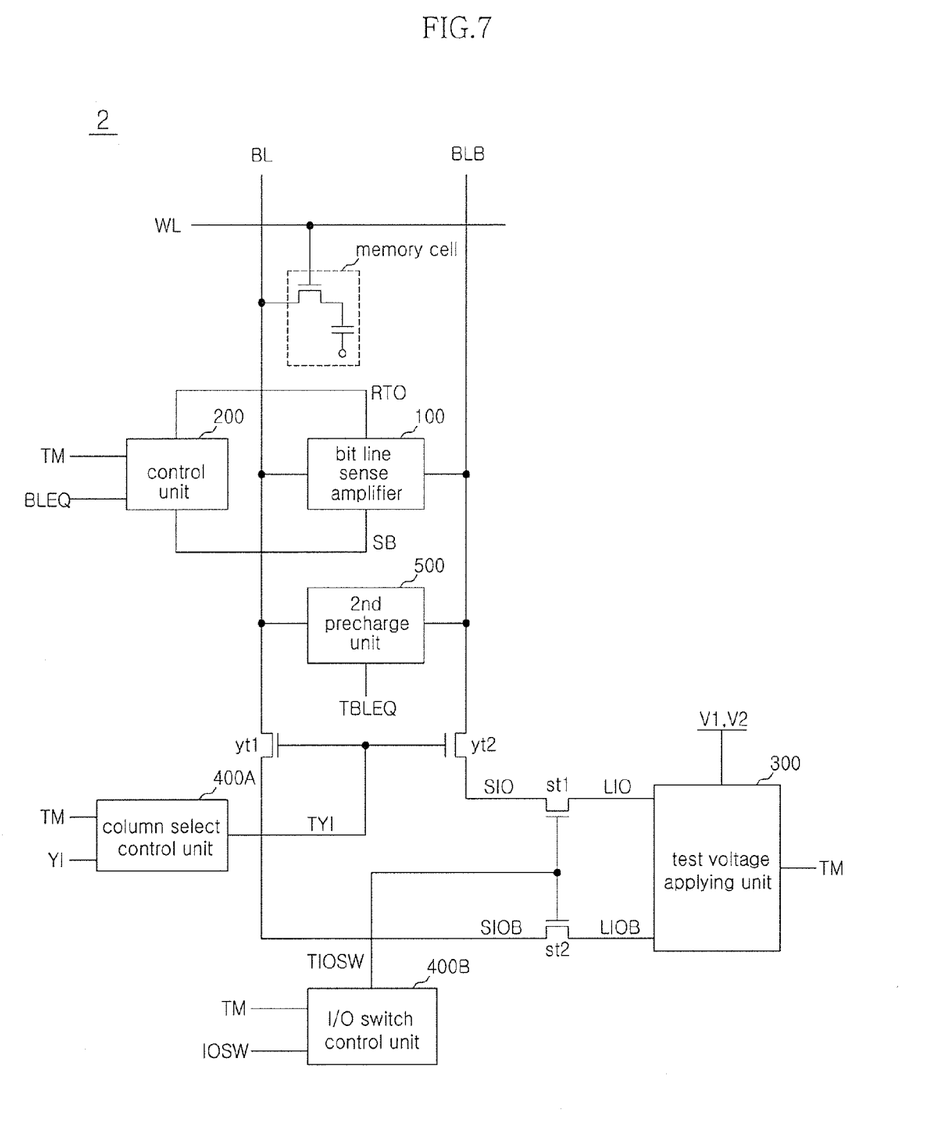
FIG. 7 is a block diagram schematically showing a configuration of a semiconductor memory apparatus according to another embodiment of the present invention.

FIG. 7 is a block diagram schematically showing a configuration of a semiconductor memory apparatus according to another embodiment of the present invention. As shown in FIG. 7, the semiconductor memory apparatus 2 according to an embodiment includes a bit line pair BL and BLB, a bit line sense amplifier 100, first data I/O lines SIO and SIOB, second data I/O lines LIO and LIOB, and a test voltage applying unit 300. The bit line BL is electrically connected to a memory cell of a memory cell array which is included in the semiconductor memory apparatus 2. The bit line sense amplifier 100 is electrically connected to the bit line pair BL and BLB to detect and amplify differences in voltage levels of the bit line pair BL and BLB. The first data I/O lines SIO and SIOB are electrically connected to the bit line pair BL and BLB. More specifically, the first data I/O lines SIO and SIOB are electrically connected to the bit line pair BL and BLB through first switching transistors yt1 and yt2. A control column selection signal 'TYI' is generated to turn on/off the first switching transistors yt1 and yt2. The second data I/O lines LIO and LIOB are electrically connected to the first data I/O lines SIO and SIOB. More specifically, the second data I/O lines LIO and LIOB are electrically connected to the first data I/O lines SIO and SIOB through second switching transistors st1 and st2. A control I/O switching signal 'TIOSW' is generated to turn on/off the second switching transistors st1 and st2. Although not shown in FIG. 7, the semiconductor memory apparatus 2 can include a plurality of bit line pairs such that the first switching transistors yt1 and yt2 are one group of a plurality of transistor groups each corresponding to a bit line pair electrically connected to first data I/O lines SIO and SIOB; and the second switching transistors st1 and st2 are one group of a plurality of transistor groups each corresponding to first data I/O lines SIO and SIOB electrically connected to second data I/O lines LIO and LIOB as well. Thus the plurality of bit line pairs are connected to a plurality of memory cells and a plurality of bit line sense amplifiers. In such a case, the control column selection signal 'TYI' will be a plurality of column selection signals 'TYI' each controlling transistors of a first switching transistor group, and the control I/O switching signal 'TIOSW' will be a plurality of control I/O switching signals each controlling transistors of a second switching transistor group. In another embodiment, it is preferable that all of the control column selection signals 'TYI' and all of the control I/O switching signals 'TIOSW' are enabled when the test mode signal 'TM' is enabled.

The test voltage applying unit 300 applies the test voltages V1 and V2 to the second data I/O lines LIO and LIOB in response to the test mode signal 'TM'. For example, the test voltage applying unit 300 applies the test voltages V1 and V2 to the second data I/O lines LIO and LIOB when the test mode signal 'TM' is enabled, and does not apply the test voltages V1 and V2 to the second data I/O lines LIO and LIOB when the test mode signal 'TM' is disabled. When the test mode signal 'TM' is enabled, both the control column selection signal 'TYI' and the control I/O switching signal 'TIOSW' are enabled, thereby causing the bit line pair BL and BLB, the first data I/O lines SIO and SIOB, and the second data I/O lines LIO and LIOB to be electrically connected with one another. Accordingly, when the test mode signal 'TM' is enabled, the test voltage applying unit 300 applies the test voltages V1 and V2 to the second data I/O lines LIO and LIOB, thereby making it possible to set both the first data I/O lines SIO and SIOB and the bit line pair BL and BLB at desired levels of test voltages V1 and V2.

The reason for applying the test voltages V1 and V2 to the second data I/O lines LIO and LIOB (hereinafter a pair of the second data I/O lines LIO and LIOB is referred to as a second data I/O line group LIO and LIOB and a pair of the first data I/O lines SIO and SIOB is referred to as a first data I/O line group SIO and SIOB) will be explained in detail below. A semiconductor memory apparatus includes a plurality of memory cell arrays, and thus a large number of bit line pairs BL and BLB are electrically connected to memory cells of the memory cell arrays. The large number of bit line pairs BL and BLB are each electrically connected to a first data I/O line group SIO and SIOB arranged between the memory cell arrays through a first switching transistor group of the plurality of first switching transistor groups. Each of the first data I/O line groups SIO and SIOB are electrically connected to a second data I/O line group LIO and LIOB through a second switching transistor group of the plurality of second switching transistor groups. A semiconductor memory apparatus may be configured such that the number of the first data I/O line groups is less than the number of bit line pairs and the number second data I/O line groups LIO and LIOB is less than the number of first data I/O line groups. Therefore, the semiconductor memory apparatus 2 according to an embodiment applies the test voltages V1 and V2 to the second data I/O line groups, which are less in number than the bit line pairs and the first data I/O line groups, to thereby simultaneously set the voltage level of a larger number of bit line pairs as well as a larger number of the first data I/O line groups to the levels of test voltages V1 and V2 while having to apply the test voltage to fewer of the second data I/O line groups, thereby making it possible to perform a test efficiently.

Referring again to FIG. 7, a semiconductor memory apparatus 2 can further include a control unit 200. The control unit 200 may have the same structure as that of the control unit described above with reference to FIG. 1, and therefore a detailed description thereof will be omitted herein for brevity.

Additionally, the semiconductor memory apparatus 2 can further include a column select control unit 400A and an I/O switch control unit 400B. The column select control unit 400A generates the control column selection signal 'TYI' in response to the test mode signal 'TM' and the column selection signal 'YI'. The column select control unit 400A enables the control column selection signal 'TYI' when the test mode signal 'TM' is enabled, and provides the column selection signal 'YI' as the control column selection signal 'TYI' when the test mode signal 'TM' is disabled.

The I/O switch control unit 400B generates the control I/O switching signal 'TIOSW' in response to the test mode signal 'TM' and an I/O switching signal 'IOSW'. The I/O switch control unit 400B enables the control I/O switching signal 'TIOSW' when the test mode signal 'TM' is enabled, and provides the I/O switching signal 'IOSW' as the control I/O switching signal 'TIOSW' when the test mode signal 'TM' is disabled. The I/O switching signal 'IOSW' is a signal which is generated from a row decoder to select rows of the semiconductor memory apparatus 2. In other words, the I/O switching signal 'IOSW' is a signal which is enabled to electrically connect the first data I/O lines SIO and SIOB to the second data I/O lines LIO and LIOB respectively, according to row addresses.

Additionally, the semiconductor memory apparatus 2 can further include a second precharge unit 500. The second precharge unit 500 may have the same structure as that described above with reference to FIG. 1, and therefore a detailed description thereof will be omitted herein for brevity.

Figure 8:
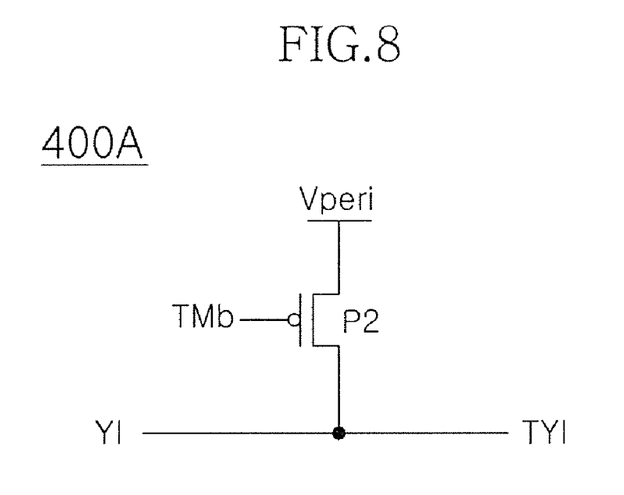
FIG. 8 is a diagram showing a configuration of an embodiment of the column select control unit of FIG. 7.

FIG. 8 is a diagram showing a configuration of an embodiment of the column select control unit of FIG. 7. As shown in FIG. 8, the column select control unit 400A includes a second PMOS transistor P2. The gate of the second PMOS transistor P2 receives a signal 'TMb', which is an inverted test mode signal 'TM', the source terminal receives a peripheral voltage Vperi, and the drain terminal is coupled to the line to which the control column selection signal 'TYI' is outputted. When the test mode signal 'TM' is enabled (e.g., at a logic high level), the second PMOS transistor P2 is turned on by the inverted signal 'TMb' having a logic low level to provide the peripheral voltage Vperi to the control column selection signal 'TYI', thereby enabling the control column selection signal 'TYI'. Conversely, when the test mode signal 'TM' is disabled, the second PMOS transistor P2 is turned off and thus the column selection signal 'YI' is provided as the control column selection signal 'TYI'. Accordingly, when the test mode signal 'TM' is enabled, the column select control unit 400A enables the control column selection signal 'TYI' regardless of the column selection signal 'YI', thereby making it possible to perform the test on the semiconductor memory apparatus 2. Conversely, when the test mode signal 'TM' is disabled, the column select control unit 400A provides the column selection signal 'YI' as the control column selection signal 'TYI', thereby making it possible to perform a normal operation on the semiconductor memory apparatus 2. As the column select control unit according to an embodiment provides a plurality of the column selection signals 'YI' as the control column selection signal 'TYI' the column select control unit may be configured with a plurality of the second PMOS transistors P2.

Figure 9:
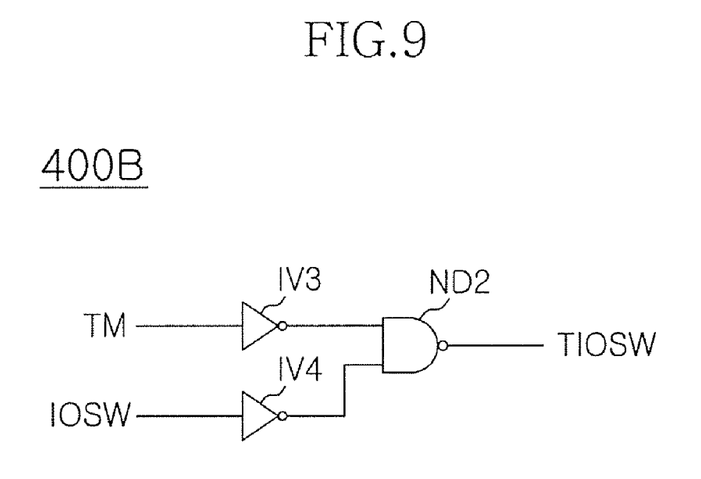
FIG. 9 is a diagram showing a configuration of an embodiment of the I/O switch control unit of FIG. 7.

FIG. 9 is a diagram showing a configuration of an embodiment of the I/O switch control unit of FIG. 7. As shown in FIG. 9, the I/O switch control unit 400B includes a third inverter IV3, a fourth inverter IV4 and a second NAND gate ND2. The third inverter IV3 inverts the test mode signal 'TM'. The fourth inverter IV4 inverts the I/O switching signal 'IOSW'. The second NAND gate ND2 receives an output of the third inverter IV3 and an output of the fourth inverter IV4 to generate the control I/O switching signal 'TIOSW'. Accordingly, when the test mode signal 'TM' is enabled to perform the test on the semiconductor memory apparatus 2, the I/O switch control unit 400B enables the control I/O switching signal 'TIOSW' regardless of the I/O switching signal 'IOSW'. Conversely, when the test mode signal 'TM' is disabled, the I/O switch control unit 400B provides the I/O switching signal 'IOSW' as the control I/O switching signal 'TIOSW', thereby making it possible to perform not the test operation but the normal operation on the semiconductor memory apparatus 2.

Figure 10:
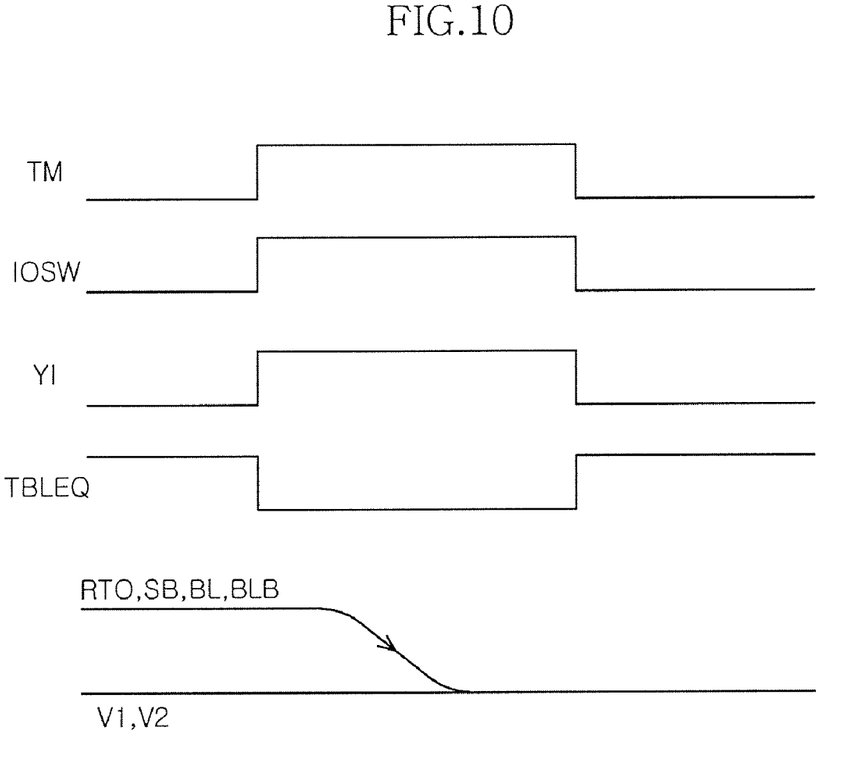
FIG. 10 is a timing diagram showing operations of a semiconductor memory apparatus according to another embodiment of the present invention.

FIG. 10 is a timing diagram showing operations of the semiconductor memory apparatus according to the embodiment shown in FIG. 7. Referring to FIGS. 7 to 10, the operations of the semiconductor memory apparatus 2 according to an embodiment will be described below. When the test mode signal 'TM' is enabled to perform the test on the semiconductor memory apparatus 2, both the control column selection signal 'TYI' and the control I/O switching signal 'TIOSW' are enabled. When both the control column selection signal 'TYI' and the control I/O switching signal 'TIOSW' are enabled, the bit line pair BL and BLB, the first data I/O lines SIO and SIOB, and the second data I/O lines LIO and LIOB are electrically connected to one another. The control unit 200 disables the bit line precharge signal 'TBLEQ' to deactivate the bit line sense amplifier 100. In other words, the control unit 200 does not provide the bit line precharge voltage VBLP to the two voltage source terminals RTO and SB of the respective bit line sense amplifiers 100. The second precharge unit 500 receives the disabled bit line precharge signal 'TBLEQ' to cause the plurality of bit line pairs BL and BLB to be floating. The test voltage applying unit 300 applies test voltages V1 and V2 to the second data I/O lines LIO and LIOB. Therefore, both the first data I/O lines SIO and SIOB and the bit line pair BL and BLB as well as the second data I/O lines LIO and LIOB become substantially the levels of test voltages V1 and V2, and thus it is possible to perform the test. At this time, when the voltage levels of the bit line pair BL and BLB become substantially the levels of test voltages V1 and V2, levels of two voltage source terminals RTO and SB of the bit line sense amplifier 100 become substantially the levels of the test voltages V1 and V2 as well.

The semiconductor memory apparatus 2 according to an embodiment can perform a test as to whether there is leakage current between the second data I/O lines LIO and LIOB, whether there is leakage current between the first data I/O lines SIO and SIOB, and whether there is leakage current between the bit line pair BL and BLB. Moreover, it can detect whether there is leakage current generated from a memory cell to a bit line BL or otherwise.

The test method of the semiconductor memory apparatus according to another embodiment will be described below. When the test mode signal 'TM' is enabled, the test voltage applying unit 300 applies the test voltages V1 and V2 to the second data I/O lines LIO and LIOB. Since levels of the test voltages V1 and V2 are arbitrarily adjustable for the purpose of the test, it is preferable that the test of whether there are leakage currents between the second data I/O lines LIO and LIOB is performed under a condition in which there is a high probability that leakage currents or stresses during the process occur. For example, when the test voltage applying unit 300 provides a positive voltage to the first test voltage V1 and a negative voltage to the second test voltage V2, the second data I/O line LIO becomes substantially the level of the first test voltage V1 and the second data I/O line LIOB becomes substantially the level of the second test voltage V2. Thereafter, as time passes the level of the second data I/O line LIO drops down to the level of the second test voltage V2 or the level of the second data I/O line LIOB goes up to the level of the first test voltage V1. Therefore, it is possible to detect whether there are micro-bridges between the second data I/O lines LIO and LIOB by detecting voltage level variations of the second data I/O lines LIO and LIOB. This test can be performed by detecting voltage levels of the I/O lines using test equipment or probes.

When the control I/O switching signal 'TIOSW' is enabled, both the second data I/O lines LIO and LIOB and the first data I/O lines SIO and SIOB are electrically connected to each other, and thus it is possible to detect whether there are micro-bridges between the first data I/O lines SIO and SIOB in a similar way. When the control column selection signal 'TYI' is enabled, the bit line pair BL and BLB, the first data I/O lines SIO and SIOB, and the second data I/O lines LIO and LIOB are electrically connected to one another. Therefore, it is possible to detect whether there are micro-bridges between bit line pair BL and BLB.

A method to detect whether there are leakage currents in a memory cell of the semiconductor memory apparatus according to another embodiment will be described below. Firstly, a first level data is stored in a memory cell by performing a writing operation. When the test mode signal 'TM' is enabled, the bit line sense amplifier 100 is disabled and test voltages V1 and V2 are applied to the bit line pair BL and BLB. At this time, it is preferable that the test voltages V1 and V2 are negative voltages when the first level data is a logic high level and the test voltages V1 and V2 have positive voltages when the first level data is a logic low level. This is to cause a condition in which leakage currents are easily generated from the memory cell to the bit line BL. At this time, if there are leakage currents from the memory cell to the bit line BL, the first level data stored in the memory cell will be damaged, and if there are not leakage currents from the memory cell to the bit line BL, the first level data stored therein will be retained. Afterwards, by performing a reading operation, it is possible to detect whether there are leakage currents depending on whether data stored in the memory cell is retained.

Therefore, according to embodiments of the present invention, since it is possible to perform a test by setting levels of a bit line pair to desired levels of test voltages, it takes less time to perform a test, thereby making it possible to effectively detect whether there are micro-bridges between lines of a semiconductor memory apparatus and whether there are leakage currents from a memory cell.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus comprising a bit line sense amplifier and a bit line pair, the semiconductor memory apparatus being configured to deactivate the bit line sense amplifier and apply a test voltage to the bit line pair in a test mode during which a test is performed.

2. The semiconductor memory apparatus of claim 1, wherein the semiconductor memory apparatus further comprises:
   a control unit configured to control the bit line sense amplifier in response to a bit line equalizing signal and a test mode signal; and
   first data I/O lines electrically connected to the bit line pair through switching transistors; and
   a test voltage applying unit configured to apply the test voltage to the first data I/O lines in response to the test mode signal.

3. The semiconductor memory apparatus of claim 2, wherein the semiconductor memory apparatus is configured to turn on the switching transistors when the test mode signal is enabled so as to electrically connect the first data I/O lines to the bit line pair.

4. The semiconductor memory apparatus of claim 2, wherein the control unit is configured to deactivate the bit line sense amplifier when the test mode signal is enabled.

5. The semiconductor memory apparatus of claim 2, wherein the control unit comprises:
   a bit line precharge signal generating unit configured to generate a bit line precharge signal in response to the bit line equalizing signal and the test mode signal; and
   a first precharge unit configured to precharge voltage source terminals of the bit line sense amplifier to a level of a bit line precharge voltage in response to the bit line precharge signal.

6. The semiconductor memory apparatus of claim 5, wherein the bit line precharge signal generating unit is configured to disable the bit line precharge signal when the test mode signal is enabled.

7. The semiconductor memory apparatus of claim 5, wherein the semiconductor memory apparatus further comprises a second precharge unit configured to precharge the bit line pair to the level of the bit line precharge voltage in response to the bit line precharge signal.

8. The semiconductor memory apparatus of claim 2, wherein the test voltage includes first and second test voltages, and
   the test voltage applying unit comprises:
   a first voltage applying unit configured to apply the first test voltage to a first data I/O line IO of the first data I/O lines in response to the test mode signal, the first data I/O line IO being electrically connected to a first bit line of the bit line pair when the switching transistors are turned on; and
   a second voltage applying unit configured to apply the second test voltage to a first data I/O line IOB of the first data I/O lines in response to the test mode signal, the first data I/O line IOB being electrically connected to a second bit line of the bit line pair when the switching transistors are turned on.

9. A semiconductor memory apparatus comprising:
   a plurality of bit line pairs electrically connected to memory cells;
   a bit line sense amplifier configured to detect and amplify potentials of a bit line pair;
   a first data I/O lines electrically connected to the bit line pair through first switching transistors which are controlled to be turned on/off in response to control column selection signals;
   a second data I/O lines electrically connected to the first data I/O lines through second switching transistors which are controlled to be turned on/off in response to control I/O switching signals; and
   a test voltage applying unit configured to apply a test voltage to the second data I/O lines in response to a test mode signal.

10. The semiconductor memory apparatus of claim 9, wherein the test voltage includes first and second test voltages, and
    the test voltage applying unit comprises:
    a first voltage applying unit configured to apply the first test voltage to second data I/O line LIO in response to the test mode signal; and
    a second voltage applying unit configured to apply the second test voltage to second data I/O line LIOB in response to the test mode signal.

11. The semiconductor memory apparatus of claim 9, wherein the semiconductor memory apparatus is configured to enable the control column selection signals so as to turn on the first switching transistors when the test mode signal is enabled.

12. The semiconductor memory apparatus of claim 11, wherein the semiconductor memory apparatus further comprises a column select control unit configured to enable the control column selection signals when the test mode signal is enabled and to provide column selection signals as the control column selection signals when the test mode signal is disabled.

13. The semiconductor memory apparatus of claim 11, wherein the semiconductor memory apparatus is configured to enable the control I/O switching signals so as to turn on the second switching transistors when the test mode signal is enabled.

14. The semiconductor memory apparatus of claim 13, wherein the semiconductor memory apparatus further comprises an I/O switch control unit configured to enable of the control I/O switching signals when the test mode signal is enabled and to provide I/O switching signals as the control I/O switching signals when the test mode signal is disabled.

15. The semiconductor memory apparatus of claim 9, wherein the bit line sense amplifier is configured to be deactivated when the test mode signal is enabled.

16. The semiconductor memory apparatus of claim 15, wherein the semiconductor memory apparatus further includes a control unit controlling the bit line sense amplifier in response to the bit line equalizing signal and the test mode signal.

17. The semiconductor memory apparatus of claim 16, wherein the control unit comprises:
    a bit line precharge signal generating unit configured to generate a bit line precharge signal in response to the bit line equalizing signal and the test mode signal; and
    a first precharge unit configured to precharge voltage source terminals of the bit line sense amplifier in response to the bit line precharge signal, the voltage source terminals of each bit line sense amplifier being precharged to a level of a bit line precharge voltage.

18. The semiconductor memory apparatus of claim 17, wherein the bit line precharge signal generating unit is configured to disable the bit line precharge signal when the test mode signal is enabled.

19. The semiconductor memory apparatus of claim 17, wherein the semiconductor memory apparatus further comprises a second precharge unit configured to precharge the bit line pair in response to the bit line precharge signal, the bit line pair being precharged to a level of a bit line precharge voltage.

20. A test method of a semiconductor memory apparatus that includes:
- a bit line pair electrically connected to a memory cell;
- first data I/O lines electrically connected to the bit line pair through first switching transistors; and
- second data I/O lines electrically connected to the first data I/O lines through second switching transistors,
- the test method comprising:
- performing a test to determine the occurrence of leakage current between the second data I/O lines, the test comprising applying a test voltage to the second data I/O lines when in a test mode.

21. The test method of claim 20, wherein the test voltage includes first and second test voltages, and
- the test to determine the occurrence of leakage current between the second data I/O lines comprises applying the first test voltage to a second data I/O line LIO of the second data I/O lines and applying the second test voltage to the second data I/O line LIOB of the second data I/O lines, when in a test mode.

22. The test method of claim 20, further comprising performing a test to determine the occurrence of leakage current between the first data I/O lines, the test to determine the occurrence of leakage current between the first data I/O lines comprising turning on the second switching transistors and applying the test voltage to the first data I/O lines, when in the test mode.

23. The test method of claim 22, further comprising performing a test to determine the occurrence of leakage current between the bit line pair, the test to determine the occurrence of leakage current between the bit line pair comprising turning on the first switching transistors and applying the test voltage to the bit line pair, when in the test mode.

24. A test method of a semiconductor memory apparatus that includes a bit line pair electrically connected to a memory cell and a bit line sense amplifier, the test method comprising:
- storing a first level data in the memory cell;
- deactivating the bit line sense amplifier when in a test mode;
- setting the bit line pair to a level of a test voltage by applying the test voltage to the bit line pair when in the test mode; and
- reading data stored in the memory cell after having set the bit line pairs to levels of the test voltage to determine whether the data corresponds to the first level data.

25. The test method of claim 24, wherein the test method further comprises causing the bit line pair to be floating before setting the bit line pair to a level of the test voltage.

26. The test method of claim 24, wherein the semiconductor memory apparatus further comprises first data I/O lines selectively electrically connected to the bit line pair and second data I/O lines selectively electrically connected to the first data I/O lines, wherein setting the bit line pair to a level of the test voltage comprises:
- electrically connecting the bit line pair to the first data I/O lines when in the test mode;
- electrically connecting the first data I/O lines to the second data I/O lines when in the test mode; and
- applying the test voltage to the second data I/O lines when in the test mode.

27. The test method of claim 24, wherein the level of the test voltage is set to cause a condition in which leakage current is generated from the memory cell storing the first level data to the bit line pair.

* * * * *